United States Patent
Okojie

(10) Patent No.: US 10,381,455 B1
(45) Date of Patent: Aug. 13, 2019

(54) DIFFUSION BARRIER SYSTEMS (DBS) FOR HIGH TEMPERATURE SEMICONDUCTOR ELECTRICAL CONTACTS

(71) Applicant: United States of America as represented by the Administrator of NASA, Washington, DC (US)

(72) Inventor: Robert Okojie, Strongsville, OH (US)

(73) Assignee: United States of America as Represented by the Administrator of National Aeronautics and Space Administration, Washington, DC (US)

( * ) Notice: Subject to any disclaimer, the term of this patent is extended or adjusted under 35 U.S.C. 154(b) by 230 days.

(21) Appl. No.: 15/253,154

(22) Filed: Aug. 31, 2016

Related U.S. Application Data

(60) Provisional application No. 62/217,216, filed on Sep. 11, 2015.

(51) Int. Cl.
| | |
|---|---|
| H01L 23/52 | (2006.01) |
| H01L 21/302 | (2006.01) |
| H01L 29/49 | (2006.01) |
| H01L 23/532 | (2006.01) |
| H01L 49/02 | (2006.01) |

(52) U.S. Cl.
CPC .... *H01L 29/4941* (2013.01); *H01L 23/53252* (2013.01); *H01L 28/75* (2013.01)

(58) Field of Classification Search
CPC .................................................. H01L 29/4941
USPC ................. 438/653, 643, 627, 551; 257/751
See application file for complete search history.

(56) References Cited

U.S. PATENT DOCUMENTS

| | | | |
|---|---|---|---|
| 5,270,252 A | 12/1993 | Papanicolaou | |
| 5,929,523 A | 7/1999 | Parsons | |
| 6,090,658 A * | 7/2000 | Joo | H01L 28/75 |
| | | | 438/240 |
| 6,388,272 B1 | 5/2002 | Odekirk | |
| 6,410,460 B1 | 6/2002 | Shalish et al. | |
| 6,413,589 B1 | 7/2002 | Li | |
| 6,544,674 B2 | 4/2003 | Tuller et al. | |
| 6,627,969 B1 * | 9/2003 | Jain | H01L 23/5252 |
| | | | 257/530 |
| 7,304,349 B2 | 12/2007 | Shulze et al. | |
| 7,767,572 B2 * | 8/2010 | Jiang | H01L 21/2855 |
| | | | 438/597 |
| 8,220,990 B2 | 7/2012 | Mitchell et al. | |
| 8,309,987 B2 | 11/2012 | Derluyn et al. | |
| 8,809,138 B2 | 8/2014 | Derluyn et al. | |
| 8,893,711 B2 | 11/2014 | Kennedy | |
| 8,901,414 B2 * | 12/2014 | Baker-O'Neal | |
| | | | H01L 31/022425 |
| | | | 136/252 |
| 8,957,522 B2 | 2/2015 | Sasaki et al. | |
| 9,099,517 B2 | 8/2015 | Konstantinov | |
| 9,099,545 B2 * | 8/2015 | Akiyama | H01L 21/324 |
| | | | 438/285 |
| 9,252,297 B2 * | 2/2016 | Lin | H01L 31/02168 |
| 9,899,325 B2 * | 2/2018 | Joshi | H01L 23/53238 |

(Continued)

*Primary Examiner* — Calvin Lee
(74) *Attorney, Agent, or Firm* — Robert H. Earp, III; William M. Johnson

(57) ABSTRACT

A diffusion barrier system may prevent migration of gold, oxygen, or both on a plurality of ohmic contacts. The diffusion barrier system may include a first barrier system or a second barrier system. Each barrier system may include a first metallization layer, a second metallization layer, and a third metallization layer.

14 Claims, 17 Drawing Sheets

(56) References Cited

U.S. PATENT DOCUMENTS

2013/0277845 A1 10/2013 Chen et al.
2013/0313570 A1* 11/2013 Sdrulla ............... H01L 29/7806
　　　　　　　　　　　　　　　　　　　　　　　257/77
2016/0020178 A1 1/2016 Chen et al.

* cited by examiner

W (300 nm)/Pt (100 nm)/Pt (100 nm)/TaSi₂ (400 nm)/Pt (100 nm) Diffusion Barrier System with W-Ni Ohmic Contact (Sample 1)

W (300 nm)/Pt (100 nm)/TaSi₂ (400 nm)/Pt (100 nm) Diffusion Barrier System with W:Ni Ohmic Contact (Sample 1)

108

W (300 nm)/Pt (100 nm)/TaSi₂ (400 nm)/Pt (100 nm) Diffusion Barrier System with Ti/W Ohmic Contact (Sample 3)

W (300 nm)/Pt (100 nm)/TaSi₂ (400 nm)/Pt (200 nm) Diffusion Barrier System with W:Ni Ohmic Contact (Sample 2)

W (300 nm)/Pt (100 nm)/TaSi₂ (400 nm)/Pt (200 nm) Diffusion Barrier System with W:Ni Ohmic Contact (Sample 2)
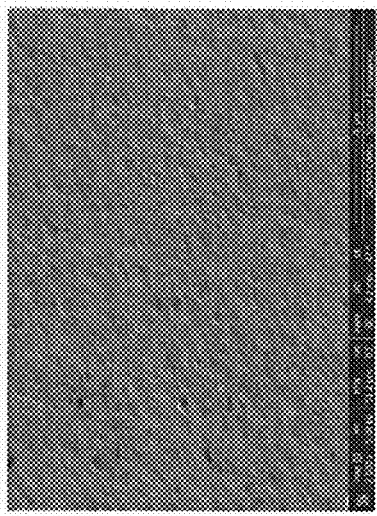
Fig. 3E
308
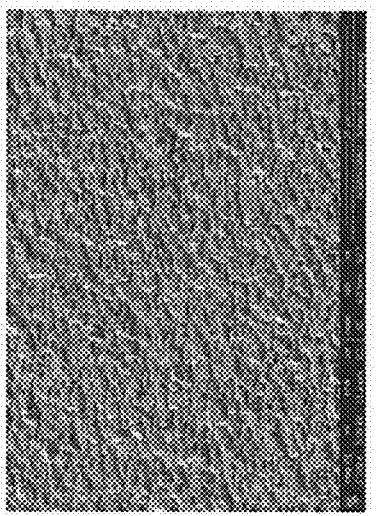
Fig. 3F
310

W (300 nm)/Pt (100 nm)/TaSi₂ (400 nm)/Pt (200 nm) Diffusion Barrier System with Ti/W Ohmic Contact (Sample 4)

W (300 nm)/Ti (100 nm)/Pt (300 nm) Diffusion Barrier System with W:Ni Ohmic Contact (Sample 6a and b)

508

510

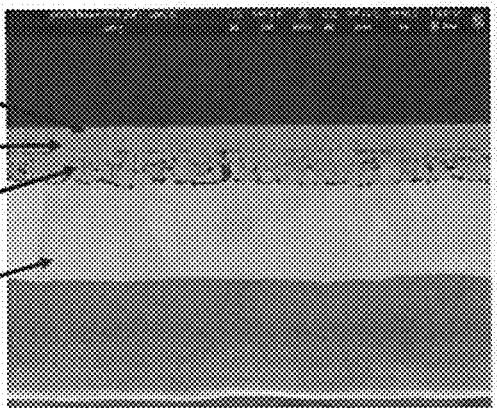
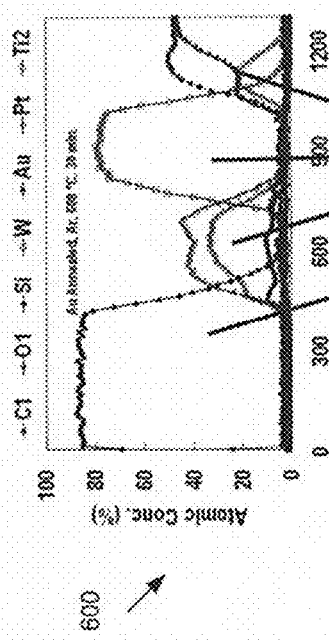
Fig. 6A
Fig. 6B
W (300 nm)/Ti (100 nm)/Pt (300 nm) Diffusion Barrier System with Ti/W Ohmic Contact (Sample 8a and b)

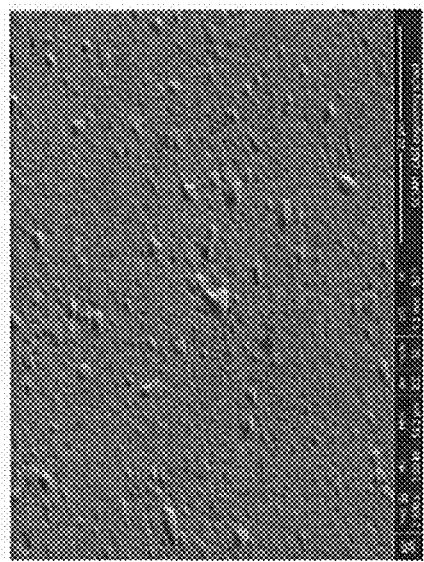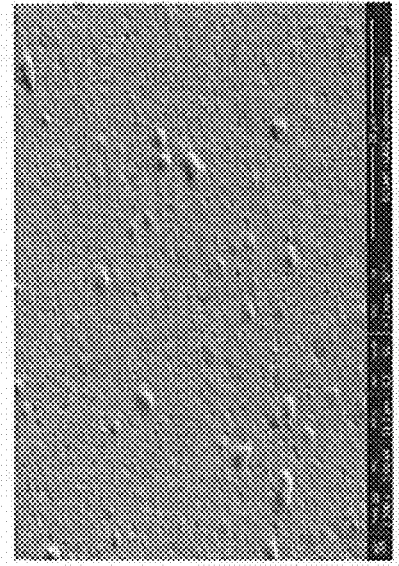
Fig. 6E · Fig. 6F
W (300 nm)/Ti (100 nm)/Pt (300 nm) Diffusion Barrier System with Ti/W Ohmic Contact (Sample 8a and b)
608
610

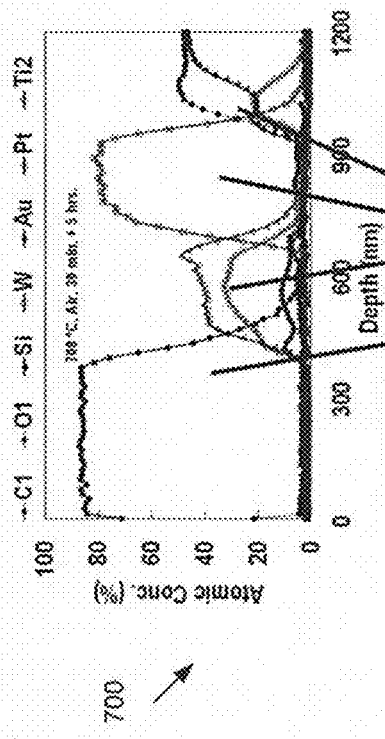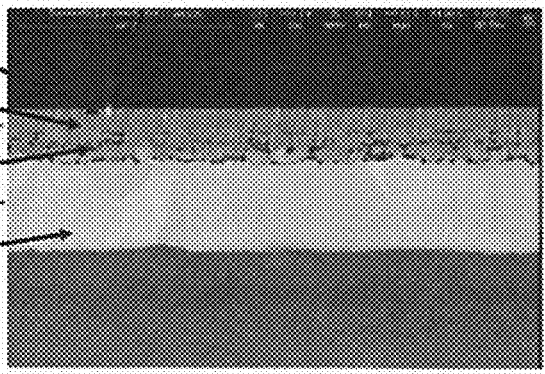
Fig. 7A
Fig. 7B
Diffusion barrier characteristics of the Pt/Ti/W diffusion barrier system against Au and O2 after prolonged soak at 700 C in air (Sample 8b).

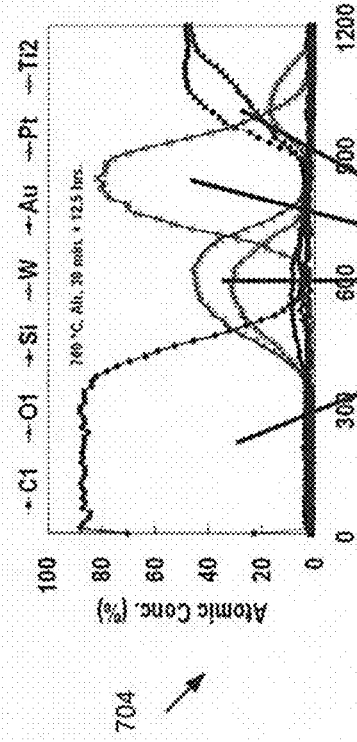
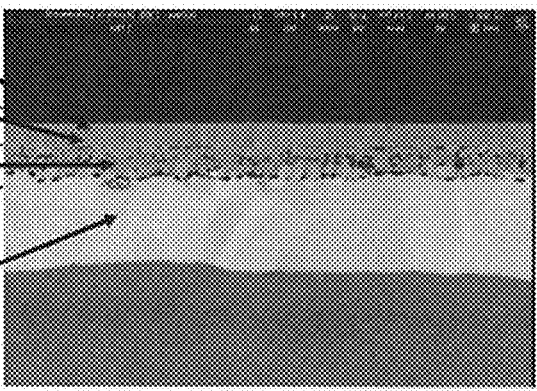
Fig. 7C
Fig. 7D
Diffusion barrier characteristics of the Pt/Ti/W diffusion barrier system against Au and O2 after prolonged soak at 700 C in air (Sample 8b).

DIFFUSION BARRIER SYSTEMS (DBS) FOR HIGH TEMPERATURE SEMICONDUCTOR ELECTRICAL CONTACTS

CROSS REFERENCE TO RELATED APPLICATION

This application claims the benefit of U.S. Provisional Patent Application Ser. No. 62/217,216 filed Sep. 11, 2015. The subject matter of this earlier-filed application is hereby incorporated by reference in its entirety.

ORIGIN OF THE INVENTION

The invention described herein was made by employees of the United States Government and may be manufactured and used by or for the Government for Government purposes without the payment of any royalties thereon or therefore.

FIELD

The present invention generally pertains to formation of various DBSs, and more specifically, to DBSs that reduce or prevent diffusion of gold and oxygen through an electrical metallization stack to an underlying semiconductor.

BACKGROUND

As the operation of certain class of semiconductor electronic and sensing devices is extended to temperatures greater than 500° C., the degradation of the contact metallization to these devices tend to increase at near exponential rate. The resultant outcome is the correspondingly gradual operational degradation of the devices, eventually leading to premature catastrophic failure. The primary mechanisms responsible for such failures are: (1) oxidation of the contact metallization by adventitious oxygen diffusion into the metallization from outside, which leads to increase in the resistance of the metallization; (2) the inter-mixing of the multiple metallization layers that constitute the metallization system leads to micro-structural phase transformations, void formation, Kirkendall vacancies, and grain boundary nucleation, which all cooperatively act to degrade the electrical functional characteristics of the metallization; and (3) inter-metallic diffusion to the semiconductor interface, forming a new interfacial layer with the semiconductor, thus changing the metal/semiconductor interface electronic characteristics from either ohmic to Schottky or Schottky to ohmic contacts.

Conventional semiconductor pressure sensors are typically rated up to 125° C. One reason is because this class of semiconductors, such as silicon, is limited by their material properties at higher temperatures and enhanced surface reactivity with the contact metallization. Extending the device operation beyond its operating temperature limit leads to the degradation of performance and eventual catastrophic failure in a very short time. In the absence of alternative devices that can operate at higher temperatures, various cooling strategies have been deployed, which extends sensor operation to ~350° C.

However, by applying this strategy new challenges are introduced. For example, water cooling can compromise signal integrity, since it couples externally sourced cold temperature and the turbulence generated by the flowing coolant with the temperature of the test environment to distort the actual reading. Alternatively, the pressure sensors are recessed a few inches to feet away to a lower temperature location via an infinite tube. The disadvantages of this strategy include the introduction of propagation delays of the pressure waves to the sensor. Considering that the infinite tube is essentially an acoustic filter, the attenuation of critical thermos-acoustic frequencies that are responsible for the instabilities could be missed, thus making it difficult to detect and mitigate such instabilities that might damage engine components. The bulkiness that is typically associated with the water- or gas-cooled sensors makes it difficult to be inserted deeper into the environment.

Recent advances made in uncooled Silicon Carbide (SiC) piezoresistive pressure sensor technology have led to its beta applications in combustor and jet engine ground experiments to directly measure dynamic pressure at temperatures up to 600° C. Therefore, the technology offers promise for eventual applications in other high temperature environments, such as jet engines, nuclear power plants, pharmaceutical plants, and automobiles, without the need for cooling.

As SiC pressure sensors are operated at 600° C., the long term operational reliability may be challenged by the same prevailing failure mechanisms that are manifested at higher temperatures. The degradation in the reliability is represented by the drifts in the zero pressure offset voltage (ZPO) when the SiC pressure sensor is operating at the fixed 600° C. over time. Because the ZPO voltage is the calibrated reference voltage prior to pressure sensor use, any deviation from such reference value during operation will introduce significant measurement errors during use. The random nature of the drift phenomena eliminates the possible implementation of commonly practiced temperature compensation as a solution.

It has been determined that the cause of the ZPO drift is largely due to the reaction kinetics and thermodynamic activities occurring within the electrical contact metallization and at the metal/SiC interface. At high temperature, inter metallic diffusion between the metal layers lead to material phase transformation. Also, at high temperature, there is a continuous reaction between the contact metallization and the underlying SiC semiconductor. The combination of these results in changes in the resistance of the metallurgical junction, leading to changes in the ZPO as function of time. The oxidation of the metallization by migrating oxygen from the outside leads to premature sensor degradation. These mechanisms must be eliminated or significantly controlled in order for the sensor to operate reliably in the duration of the test, with minimal change in the reference voltage.

Accordingly, improved DBSs may be beneficial.

SUMMARY

Certain embodiments of the present invention may be implemented and provide solutions to the problems and needs in the art that have not yet been fully solved by the conventional technologies discussed above. For example, some embodiments of the present invention pertain to DBSs that prevent diffusion of unwanted elements that would degrade device operation at 600° C. This is an enabler to SiC sensors and electronics needed to operate reliably and robustly in high temperature environments without the need for cooling. This may be applied on devices to ensure long term operational stability. The absence of cooling components translates to reduced weight of the packaged sensor, and also, the absence of a bulky cooling package allows for ease of sensor insertion further into the test article.

In an embodiment, an apparatus may include a diffusion barrier system configured to prevent migration of gold, oxygen, or both on a plurality of ohmic contacts. The diffusion barrier system may include a first barrier system or a second barrier system. The first barrier system may include a first metallization layer, a second metallization layer, and a third metallization layer, and the second barrier system comprises a first metallization layer, a second metallization layer, and a third metallization layer.

In another embodiment, a diffusion barrier system may include a first barrier system or a second barrier system configured to prevent migration of gold and oxygen on a three different ohmic contacts. The first barrier system may a plurality of metallization layers, and the second barrier system may include a plurality of barrier systems.

In yet another embodiment, a diffusion barrier system may include a first barrier system or a second barrier system configured to prevent migration of gold, oxygen, or both on a plurality of ohmic contacts.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which:

FIGS. 3A-3F (sample 2) illustrate W (300 nm)/Pt (100 nm)/TaSi$_2$ (400 nm)/Pt (200 nm) DBS with W:Ni Ohmic contact, according to an embodiment of the present invention.

FIGS. 6A-6F (samples 8a and 8b) illustrate W (300 nm)/Ti (100 nm)/Pi (300 nm) DBS with Ti/W Ohmic Contact, according to an embodiment of the present invention.

FIGS. 7A-7D (sample 8b) illustrate diffusion barrier characteristics of the Pt/Ti/W DBS against gold (Au) and oxygen (O$_2$) after prolonged soak at 700° C. in air (sample 8b), according to an embodiment of the present invention.

DETAILED DESCRIPTION OF THE EMBODIMENTS

Figure 1A:
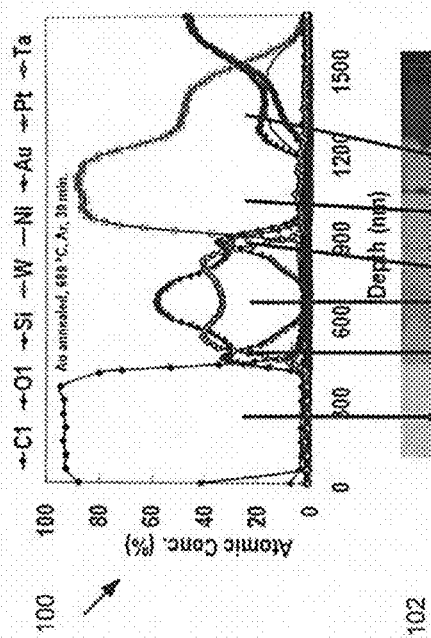
FIGS. 1A-1E (sample 1) illustrate a W (300 nm)/Pt (100 nm)/TaSi$_2$ (400 nm)/Pt (100 nm) DBS with W:Ni Ohmic Contact, according to an embodiment of the present invention.
Figure 1B:
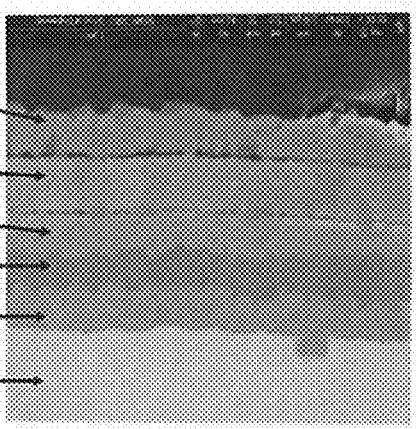

Some embodiments of the present invention generally pertain to a series of DBSs within a semiconductor metallization stack. The semiconductor metallization stack may prevent degradation of the ohmic contact metallization. The degradation of the ohmic contact metallization has been determined to be one of the key reasons for the instability of the SiC sensors during long term operation at 600° C. Another failure mechanism that was identified was the inter-metallic diffusion between the ohmic contact metallization to the SiC semiconductor and the top diffusion barrier layer. Extensive failure analyses confirmed that the observed drift of the zero pressure offset (ZPO) reference voltage was largely driven by the zone reaction kinetics and microstructural phase transformations occurring within the ohmic contact metallization and at the metal/SiC interface.

In some embodiments, a series of metallization schemes have been developed to significantly reduce the inter-metallic diffusion and phase transformations at high temperatures, significantly reducing the observed drifts in the ZPO. Examples of combination metallization stacks of the diffusion barrier mechanisms are as follows:
1. SiC/W$_x$:Ni$_y$/W/Si/Pt/TaSi$_2$/Pt/Au system
2. SiC/Ti/W/TaSi$_2$/W/Si/Pt/TaSi$_2$/Pt/Au system
3. SiC/W$_x$:Ni$_y$/W/Si/Ti/Pt/Au system
4. SiC/Ti/W/TaSi$_2$/W/Si/Ti/Pt/Au system
5. SiC/Pt$_x$:Ti$_y$:Si$_z$/W/Si/Pt/TaSi2/Pt/Au system
6. SiC/Pt$_x$:Ti$_y$:Si$_z$/W/Si/Ti/Pt/Au system Functional Operation In any of the above combinations, starting from the left, SiC is the semiconductor in which the sensor is fabricated. This is followed by the ohmic contact metallization, which is either a single element or alloy. In the above examples 1, 3, 5, and 6, W$_x$:Ni$_y$ and Pt$_x$:Ti$_y$:Si$_z$, are ohmic contact alloys to the SiC surface. In the example 2, the eventual reaction between Ti/W leads to the formation of ohmic contact to the SiC. The electrical characteristics and mechanical integrity of the metal/SiC interfaces should be maintained and undisturbed by protecting the metal/SiC interfaces from inter-metallic diffusion or oxygen (O$_2$) and gold (Au) diffusion from the outside (migrating from the right).

Put simply, the next stack of metallization layers act as the first barrier against metallic or oxygen diffusion from the right into the ohmic contact region.

In certain embodiments, the diffusion barrier should not diffuse into the ohmic contact region via inter-metallic migration process to the extent of disturbing the SiC ohmic contact interface. For example, in example 1 above, the W/Si layer is the diffusion barrier that protects the W$_x$:Ni$_y$ ohmic contact metallization from aggressive metal migration from the right. The stack of Pt/TaSi$_2$/Pt is the next level diffusion barrier, where TaSi$_2$ is Tantalum Silicide in some embodiments. This barrier prevents or significantly slows down the diffusion of the gold (Au) from the bond pad. Also, oxygen (O$_2$) that diffuses through the gold (Au) bond pad is prevented by this stack from migrating toward the ohmic contact. Due to the immiscibility of platinum (Pt) in tungsten (W), the W/Pt interface remains largely unchanged.

Example Embodiment

In some embodiments, variants of Ti/Pt and Pt/TaSi$_2$ compositions were investigated in conjunction with tungsten (W) as effective diffusion barriers against oxygen (O$_2$) and gold (Au) at temperature as high as 700° C. Some of these embodiments may prevent the migration of these species to the ohmic contact interface. The ohmic contact metallization scheme adopted in some embodiments was an alloy of W75:Ni25 at. % and Ti/W. The former was previously reported in U.S. Pat. No. 8,373,175 to remain ohmic on n-type and p-type 4H—SiC after several hours at 1,000° C.

in nitrogen ambient. Certain embodiments may be directed to developing the appropriate diffusion barriers on the ohmic contact that would effectively prevent gold (Au) and oxygen ($O_2$) migration into the ohmic contact interface during operation of the device in a less benign environment at high temperature.

Experimental Procedure

In the experimental procedure, the starting wafer included a 4H—SiC semi-insulating substrate on which a 2-μm, n-type epitaxial layer was homoepitaxially grown by chemical vapor deposition. Several square (1 cm$^2$) samples were cut from the main wafer and solvent cleaned with acetone and isopropanol, followed by immersion in equal volume of hydrogen peroxide ($H_2O_2$) and sulfuric acid ($H_2SO_4$). This was followed by rinsing in de-ionized water and blow drying with nitrogen. A 200 nm thick ohmic contact layer of W75:Ni25 at. % was sputtered from an alloy target and a protective 10 nm Si layer on samples 1, 2, 5, and 6. These samples were annealed at 1000° C. in argon (Ar) flow rate of 6 slpm for 30 minutes. Ohmic contact layers of Ti (50 nm)/W (200 nm) were sequentially sputter deposited on samples 3, 4, 7, and 8, followed by the same above anneal condition. See Table 1 below for the detailed metallization schemes.

For the second level metallization, sequential layers of W (300 nm)/Si (10 nm) were deposited on samples 1 to 4, followed by 900° C. anneal for 30 minutes. The second level metallization stacks on samples 5 and 7 and samples 6 and 8 were Ti (100 nm)/Pt (200 nm) and Ti (100 nm)/Pt (300 nm), respectively. These second layer Ti/Pt, four samples were then annealed at 700° C.

For the third layer metallization, samples 1 and 3 and samples 2 and 4 received Pt (100 nm)/TaSi$_2$ (400 nm)/Pt (100 nm) and Pt (100 nm)/TaSi$_2$ (400 nm)/Pt (200 nm), respectively, followed by a 700° C. anneal.

Finally, a 1 μm thick gold (Au) film was sputter deposited on all the samples. For clarity, complete metallization deposition sequences are shown in Table 1. There are several reasons why several anneal steps have been taken. For example, the residual stress that exists in the film after deposition should be minimized before the next layer is deposited. Failure to perform each of these anneal steps could lead to stress build-up and eventual film delamination, cracking or tear.

Next, each sample was subsequently cut into quarters and labeled a-d. Samples labeled "d" were heated in an atmospheric oven at 700° C. for 30 minutes, to simulate the packaging conditions the subsequent devices would encounter. Small amount of Dupont 5063D gold (Au) paste was applied on samples labeled "c" and also heat treated in atmospheric oven for thirty minutes. This was performed to simulate the condition during packaging when the gold (Au) paste is attached to the subsequent device and fired. Samples "d" were periodically heat treated under the same condition and analyzed. This was to help understand the transient migration of gold (Au) though the metallization stack.

The samples with the metallization stacks would be periodically treated in atmosphere and extracted for analysis. Material analyses employing Auger Electron Spectroscopy (AES), Focused Ion Beam Scanning Electron Microscopy (FIB-SEM), and Energy Dispersive Spectroscopy (EDS) were used to analyze the new product formations, zonal reactions and intermixing, phase transformations, microstructural transformations, and the migration of gold (Au) and oxygen ($O_2$) through the metallization stack.

| Sample # | Layer_1 and anneal temperature | Layer_2 and anneal temperature | Layer_3 and anneal temperature | Layer _4 |
|---|---|---|---|---|
| 1 | W75:Ni25 (200 nm)/Si (10 nm)-1000° C. | W (300 nm)/Si (10 nm)-900° C. | Pt (100 nm)/TaSi$_2$ (400 nm)/Pt (100 nm)-700° C. | Au (1 μm)-600° C. |
| 2 | W75:Ni25 (200 nm)/Si (10 nm)-1000° C. | W (300 nm)/Si (10 nm)-900° C. | Pt (100 nm)/TaSi$_2$ (400 nm)/Pt (200 nm)-700° C. | Au (1 μm)-600° C. |
| 3 | Ti (50 nm)/W (200 nm)/TaSi$_2$ (10 nm)-1000° C. | W (300 nm)/Si (10 nm)-900° C. | Pt (100 nm)/TaSi$_2$ (400 nm)/Pt (100 nm)-700° C. | Au (1 μm)-600° C. |
| 4 | Ti (50 nm)/W (200 nm)/TaSi$_2$ (10 nm)-1000° C. | W (300 nm)/Si (10 nm)-900° C. | Pt (100 nm)/TaSi$_2$ (400 nm)/Pt (200 nm)-700° C. | Au (1 μm)-600° C. |
| 5 | W75:Ni25 (200 nm)/Si (10 nm)-1000° C. | Ti (100 nm)/Pt (200 nm)-700° C. | Au (1 μm)-600° C. | |
| 6 | W75:Ni25 (200 nm)/Si (10 nm)-1000° C. | Ti (100 nm)/Pt (300 nm)-700° C. | Au (1μm)-600° C. | |
| 7 | Ti (50 nm)/W (200 nm)/TaSi$_2$ (10 nm)-900° C. | Ti (100 nm)/Pt (200 nm)-700° C. | Au (1 μm)-600° C. | |
| 8 | Ti (50 nm)/W (200 nm)/TaSi$_2$ (10 nm)-900° C. | Ti (100 nm)/Pt (300 nm)-700° C. | Au (1μm)-600° C. | |

FIGS. 1A-1E (sample 1) illustrate a W (300 nm)/Pt (100 nm)/TaSi$_2$ (400 nm)/Pt (100 nm) DBS with W:Ni Ohmic Contact, according to an embodiment of the present invention.

FIG. 1A is a graph 100 illustrating the AES depth profile of a complete metallization stack of sample 1 immediately after gold (Au) anneal at 600° C. for 30 minutes in flowing argon (Ar) as discussed earlier and in accordance with Table 1. It should be noted that this final anneal step promotes improved adhesion between gold (Au) and the surface of the previously annealed metallization stack. At the SiC interface, the W75:Ni25 at. % alloy have reacted with the SiC to form silicides of nickel (Ni) and tungsten (W) and carbide of tungsten (W). This is illustrated in FIG. 1A and the FIB-FE-SEM cross-section image 102 of FIG. 1B and mapped to the corresponding AES depth profile. The thickness of the tungsten (W) layer above the alloy remains largely unchanged, indicating little intermixing with the underlying alloy after successive 900, 700, and 600° C. anneals (see Table 1).

Figures 1C, 1D:
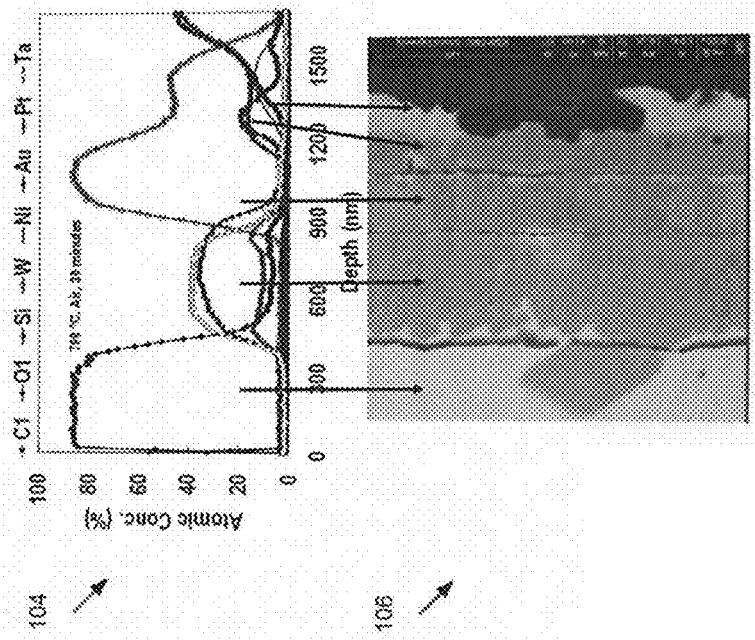
Figure 1E:
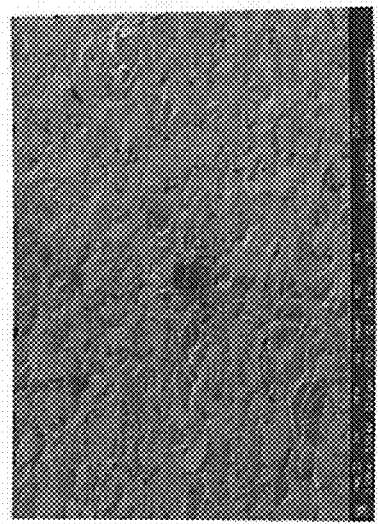

At the Pt/W interface, PtSi has formed and diffused slightly into the tungsten (W) layer. The PtSi is from an apparent 2Pt—TaSi$_2$→2PtSi+Ta reaction, with the discernable free tantalum (Ta) layer. This reaction and intermixing zone is also illustrated in the FIB-SEM image 102 of FIG. 1B, which shows a well-defined PtSi/W zone. One would readily appreciate that the reaction and intermixing zone is the region of the unreacted TaSi$_2$, which is seen in the AES and as dark gray in the SEM image. Zonal reaction symmetry is evident at both ends of the TaSi$_2$ layer, as the reaction/diffusion zone at the gold (Au) interface is a mirror image of the one at the tungsten (W) interface. After a subset of sample 1 was soaked in atmospheric oven at 700° C. for 30 minutes, it was taken out and analyzed. The results 104 and 106 are shown in FIGS. 1C and 1D for the AES depth profile and FIB-FE-SEM, respectively.

Starting from the SiC interface, the most prominent change from the pre-atmospheric soaking is the indication of gold (Au) agglomeration following migration from the top surface. This can be observed at the SiC ohmic contact interface in the AES profile. Electrically, this has the potential to cause instability as a result of the disturbance of the ohmic contact region, if the device is operated at 700° C. Also observed in the AES profile is another gold (Au) pile-up of about 20 at. % concentration level at the WNi alloy-W interface. Although not clearly discernable in the FIB-FE-SEM, it can be seen as light gray smudges straddling both sides of the WNi—W demarcation.

Another section with significant microstructural transformation and reactions is the previous $TaSi_2$ layer. The platinum (Pt) at both sides of this layer has undergone significant migration spreading and merged within the $TaSi_2$ layer. The zone reaction symmetry, although of a different microstructure and concentration profile, is still evident as there is little inbound or outbound migration of platinum (Pt). Essentially, platinum (Pt) mobility is largely confined to the gold (Au) and tungsten (W) boundaries. The relatively low level (approximately 6 at. %) of gold (Au) within this previous $TaSi_2$ layer suggests the presence of small and more tortuous grain boundary migration path. Lending credence to this suggestion is that the gold (Au) distribution within the $TaSi_2$ layer, as shown in FIB-FE-SEM of FIG. 1D, is non uniform and sporadic. The Au layer remains largely free of out-diffusing elements, particularly silicon (Si) from the $TaSi_2$ that would have promoted Au—Si eutectic formation at both ends of the gold (Au) layer. It can also be seen that oxygen ($O_2$) did not migrate through the metallization stack. Also, the surface morphology of the post-700° C. atmospheric soak, as shown in image 108 of FIG. 1E, does not have the characteristics pitting of Au—Si eutectic surface. Thus, this may suggest that the 1:4:1 $Pt/TaSi_2/Pt$ combinational ratio prevents the presence of high concentration of free silicon (Si), which would out-migrate and form the Au—Si eutectic at either side of the gold (Au) layer.

The most significant result of this barrier scheme is the absence of oxygen ($O_2$) at the concentration level that would be deleterious to the integrity of the metallization system. Of concern, however, is that at 700° C., gold (Au) broke through the two barrier stages and appears at the SiC interface.

Figure 2A:
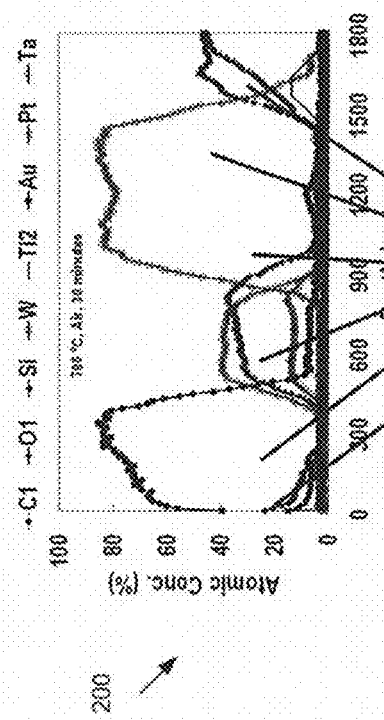
FIGS. 2A-C (sample 3) illustrate the W (300 nm)/Pt (100 nm)/TaSi$_2$ (400 nm)/Pt (100 nm) DBS with Ti/W Ohmic Contact, according to an embodiment of the present invention.
Figure 2B:
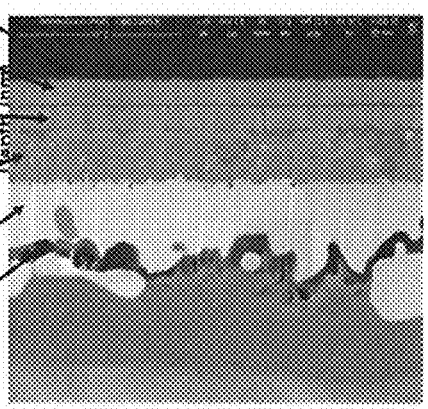
Figure 2C:
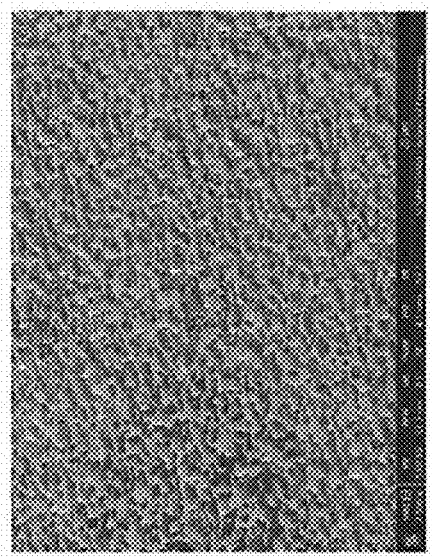
Figure 2C:

FIGS. 2A-C (sample 3) illustrate the W (300 nm)/Pt (100 nm)/$TaSi_2$ (400 nm)/Pt (100 nm) DBS with Ti/W Ohmic Contact, according to an embodiment of the present invention. After soaking in air at 700° C. for 30 minutes, the AES depth and FIB-FE-SEM image profiles were analyzed and are shown in graphs 200 and image 202 of FIGS. 2A and 2B, respectively. For this 1:4:1 $Pt/TaSi_2/Pt$ DBS on the Ti/W Ohmic Contact, very little migration, if any, of gold (Au) and oxygen ($O_2$) was observed. The SiC zone reaction was essentially the formation of stable silicide phases of titanium (Ti) and tungsten (W). The top surface of the gold (Au) appears to be pitted, as shown images of 202 of FIG. 2B and 204 of FIG. 2C, which is a characteristic of Au—Si eutectic formation.

A subset from sample 2 having DBS of W (300 nm)/Pt (100 nm)/$TaSi_2$ (400 nm)/Pt (200 nm) (1:4:2 $Pt/TaSi_2/Pt$) deposited on W75:Ni25 ohmic contact was similarly soaked in atmospheric oven separately at 600° C. and 700° C. for 30 minutes and subsequently analyzed. See, for example, FIGS. 3A-3C (sample 2).

Figures 3A, 3B:
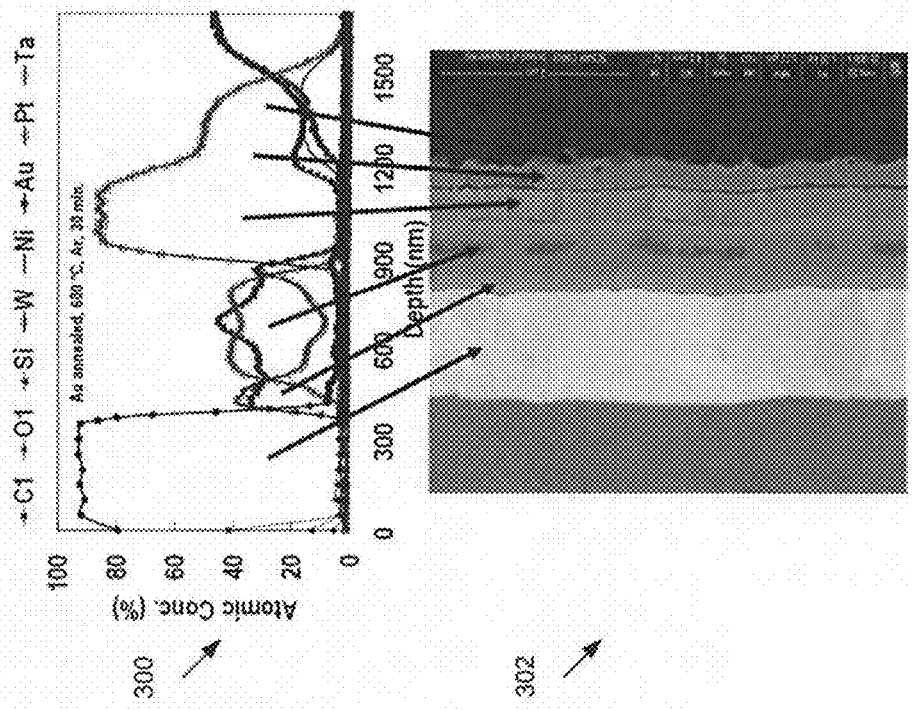
Figures 3C, 3D:
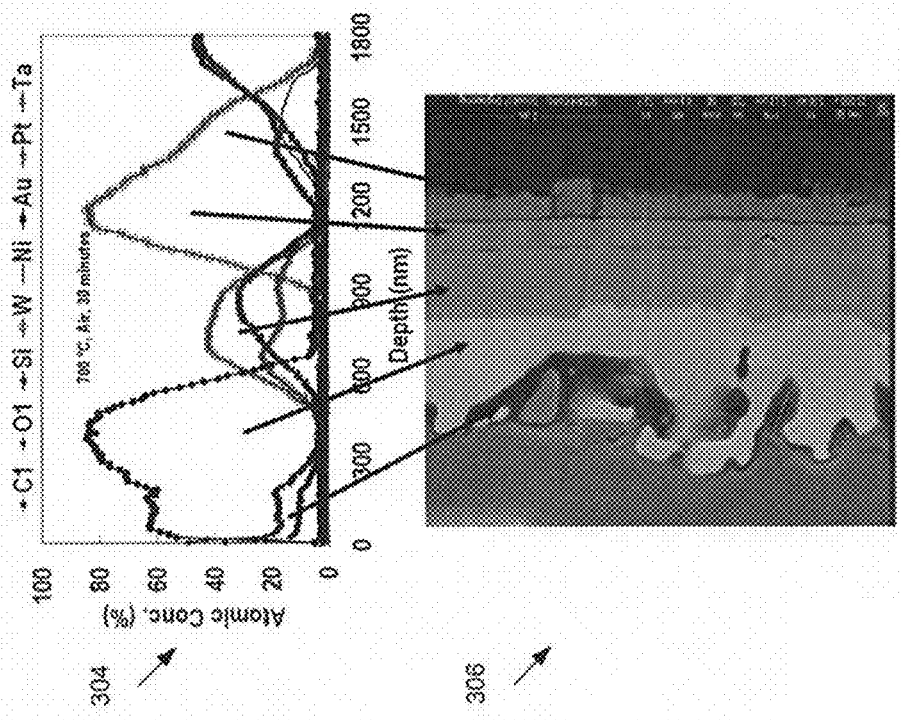

The AES depth profile of the reference sample subset that was annealed in Ar for 30 minutes at 600° C. is shown in graph 300 of FIG. 3A. For all practical purpose, the depth profile is the same as that of FIG. 1A except for two distinct variations. First, post-anneal gold (Au) surface morphologies are different, as shown in image 108 of FIG. 1E and 308 of FIG. 3E, respectively, with sample 1 (image 108 of FIG. 1E) characterized by wavy striations while sample 2 (image 310 of FIG. 3F) exhibits a relatively smoother surface morphology. Second, the characteristic symmetrical zone reactions exhibited in sample 1 at both sides of the $TaSi_2$ layer is absent in sample 2.

Also, the silicon (Si) concentration in the $TaSi_2$ matrix has dropped and the platinum (Pt) at both sides have largely merged. This may be seen in the accompanying FIB-SEM, as shown in image 302 of FIG. 3B. After the 700° C. atmospheric thermal soak for 30 minutes dramatic changes have taken place at both sides of the gold (Au) layer. For example, at the top layer, the surface morphology has transformed from the previously smooth surface, as shown in image 308 of FIG. 3E, to a surface densely populated with sub-micron solid globules and pitting. This is shown in image 310 of FIG. 3F. The corresponding AES depth profile reveals a top gold (Au) layer with intercalating silicon (Si) at the surface and sub-surface, which is due to the formation of Au—Si eutectic. In this sample, silicon (Si) had made its way into the gold and was partially oxidized at the surface. Not surprising, and as revealed in the AES profile (graph 304 of FIG. 3C and graph 306 of FIG. 3D), the resulting eutectic at the surface was invitation to surface oxidation of the silicon (Si) at 700° C. atmospheric treatment. This partial oxidation extends as deep as 300 nm into the gold (Au) layer. The presence of an Au—Si eutectic at the top surface may create a weak bond between the gold (Au) bond pad and the gold (Au) paste that would later be applied, resulting in premature device failure by detachment. There appears to be some evidence of gold (Au) diffusion through the $TaSi_2$ layer (<4 at. %) and a lower concentration that is sporadically distributed in the second stage tungsten (W) diffusion barrier. There also appears to be some broadening of gold (Au) and $TaSi_2$ matrix layers, resulting in overall thickness increase of the metallization stack. Similar to FIG. 1, inbound or outbound platinum (Pt) migration appears to be largely constrained by tungsten (W) at the bottom and gold (Au) at the top. However, the extra Pt in this system resulted in the freeing of excess silicon (Si) in the $TaSi_2$, allowing it to out diffuse and form the surface and sub-surface Au—Si eutectic. The microstructural profile at the SiC ohmic contact interface is largely unchanged and there is little evidence of gold (Au) or oxygen ($O_2$) migration to the ohmic contact and SiC interface.

Figure 4A:
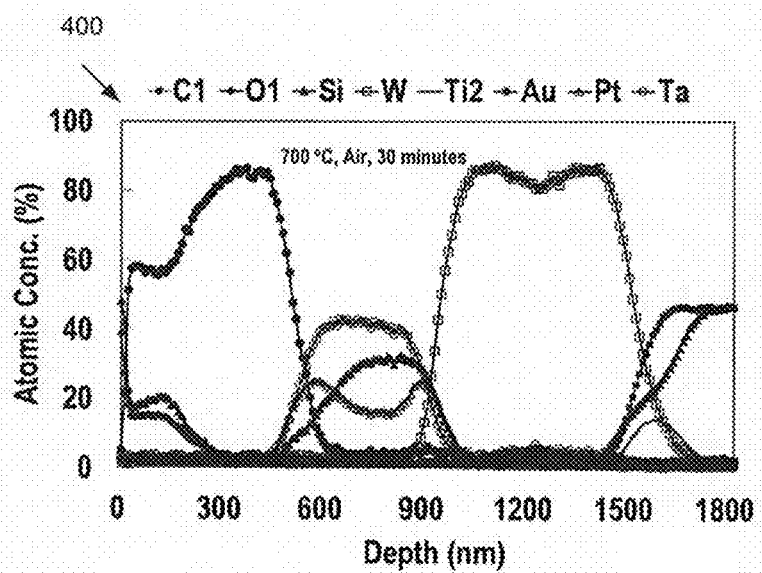
FIGS. 4A and 4B (sample 4) illustrate W (300 nm)/Pt (100 nm)/TaSi$_2$ (400 nm)/DBS with Ti/W Ohmic Contact, according to an embodiment of the present invention.
Figure 4B:
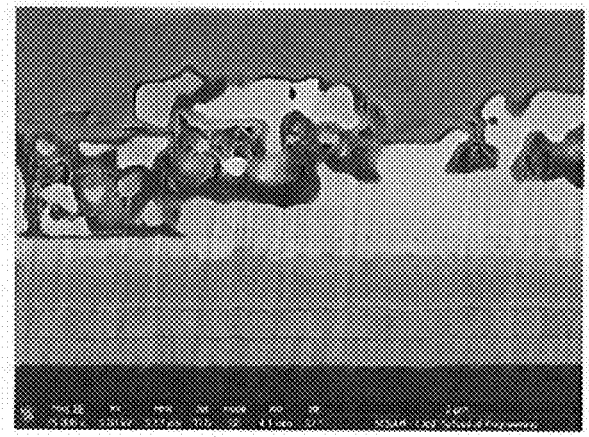

FIGS. 4A and 4B (sample 4) illustrate the results of the AES depth profile and the FIB-FESEM of W (300 nm)/Pt (100 nm)/$TaSi_2$ (400 nm)/Pt (200 nm) (1:4:2 $Pt/TaSi_2/Pt$) DBS with Ti/W Ohmic Contact, according to an embodiment of the present invention. For the most part, graph 400 of FIG. 4A and image 402 of FIG. 4B reveal that there was no significant gold (Au) migration and no platinum (Pt) migration towards the ohmic contact after 30 minutes soak at 700° C. in air.

In general, the 1:4:2 $Pt/TaSi_2/Pt$ barrier system characteristically exhibit the release of free silicon (Si) from the Pt—$TaSi_2$ reaction that subsequently out diffuses to the gold (Au) top surface and forms a eutectic layer. The presence of Au—Si eutectic at the gold (Au) surface presents an active surface for oxidation. During packaging, gold (Au) die attach is applied onto the gold (Au) bond pad and cured in atmospheric oven between 15 and 30 minutes. During the curing process oxygen front the environment and possibly within the gold (Au) attach will diffuse and migrate toward the gold (Au) bond pad. Meanwhile, free silicon (Si) from the Pt+TaSi2 reaction migrates and forms Au—Si eutectic at the gold (Au) bond pad surface. Thus, there is a reaction between oxygen ($O_2$) and the eutectic that forms an oxide between the gold (Au) attach and gold (Au) bond pad. This results in poor mechanical adhesion between the two gold (Au) surfaces. Overall, intermetallic mixing was significantly minimized, as well as the non-disruption of the ohmic contact region, by gold (Au) and oxygen ($O_2$) thereby preserving the integrity of the ohmic contact characteristics. The migration of gold (Au) toward the underlying metallization stack was also significantly mitigated.

Pt/Ti/W DBS

Samples 5 to 8 with W/Ti/Pt DBS were evaluated for their diffusion barrier properties on both W:Ni and Ti/W ohmic contacts.

Figures 5A, 5B:
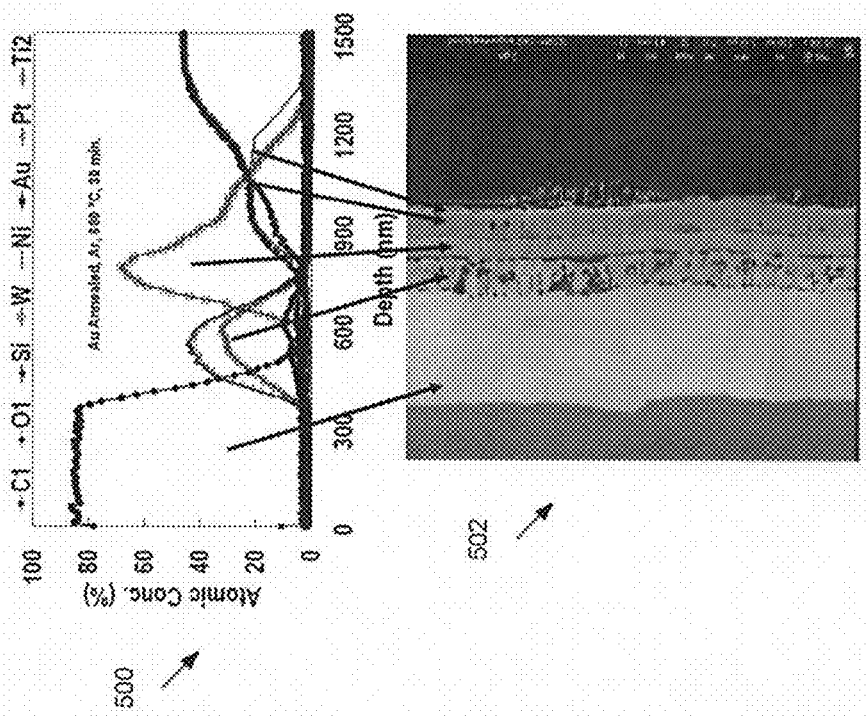
FIGS. 5A-5F (samples 6a and 6b) illustrate W (300 nm)/Ti (100 nm)/Pt (300 nm) DBS with W:Ni Ohmic Contact, according to an embodiment of the present invention.

FIGS. 5A-5F illustrate W (300 nm)/Ti (100 nm)/Pt (300 nm) DBS with W:Ni Ohmic Contact (Sample 6a and b), according to an embodiment of the present invention. The W:Ni/SiC zone reaction (after 600° C. anneal in argon for 30 minutes) shown in graph 500 of FIG. 5A (sample 6a) is similar to that observed in graph 100 of FIG. 1A and graph 300 of FIG. 3A, with formation of silicides of tungsten (W) and nickel (Ni) and variants of tungsten carbide to form the ohmic contact after 1000° C. anneal. The Ti/Pt layers on tungsten (W) appear to prevent migration of gold (Au) toward the SiC interface. Little W/Ti/Pt intermixing is also observed, while a low concentration of silicon (Si) has out-diffused from the SiC to the Pt/Ti layer. The oxygen ($O_2$) observed in the Ti/Pt bi-layer was due to the premature oxidation of the surface prior to the gold (Au) deposition, as was the case with samples 1-4. The FIB-FEM cross-section image 502 of FIG. 5B corresponding to graph 500 FIG. 5A is shown after the 600° C. anneal. The dark features within the Ti/Pt matrix in image 502 of FIG. 5B are indicative of oxygen ($O_2$), as stated earlier.

Figures 5C, 5D:
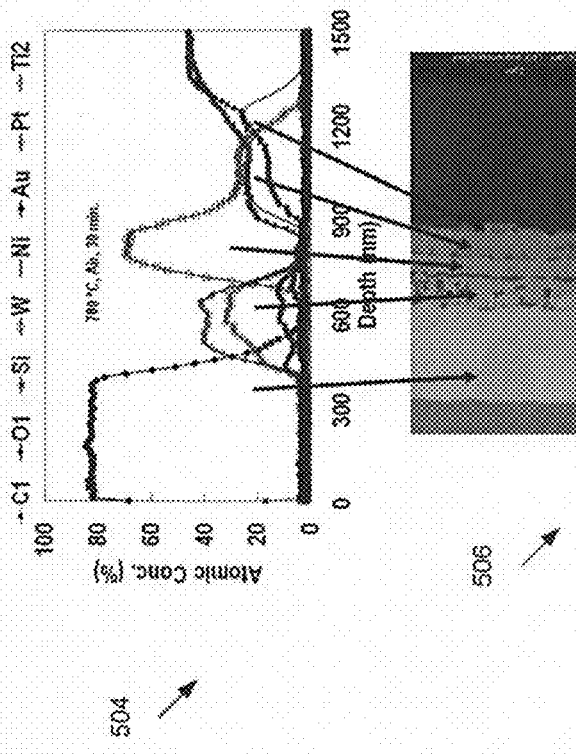
Figure 5E:
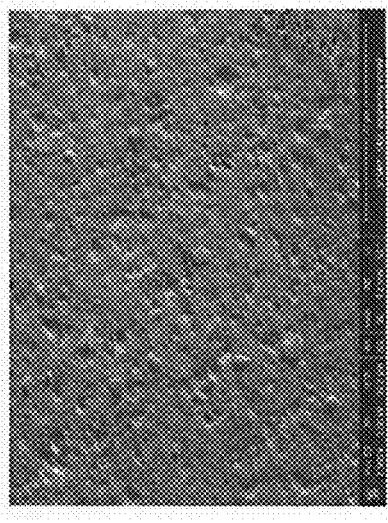
Figure 5F:
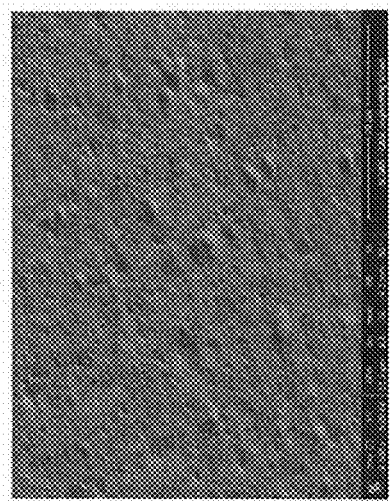

After annealing at 700° C. for 30 minutes in air, the AES depth profile is shown in graph 504 of FIG. 5C and the corresponding cross section FIB FESEM image 506 of FIG. 5D is also shown. Starting from the metal/SiC reaction zone, no significant change had occurred in the reaction zone width, just as little microstructural changes had occurred when FIGS. 5B and 5C are compared. This may suggest that the reactions had largely completed. W/Ti/Pt reaction is essentially similar to that shown in graph 500 of FIG. 5A, with very little intermixing. The inward diffusion of gold (Au) was effectively prevented by the Ti/Pt bi-layer. There appears to be a significant contrast between the surface morphologies of the W/Ti/Pt and the W/Pt/TaSi$_2$/Pt DBS. The surface morphology of the W/Ti/Pt DBS is characteristically very smooth after both anneal steps (see image 508 of FIG. 5E and image 510 of FIG. 5F), which contrasted the pitted surfaces of the latter. This W/Ti/Pt DBS essentially eliminates the deleterious effects of the Au—Si eutectic that forms at the gold (Au) surfaces and resulting in uneven surface and pitting.

Figure 6C:
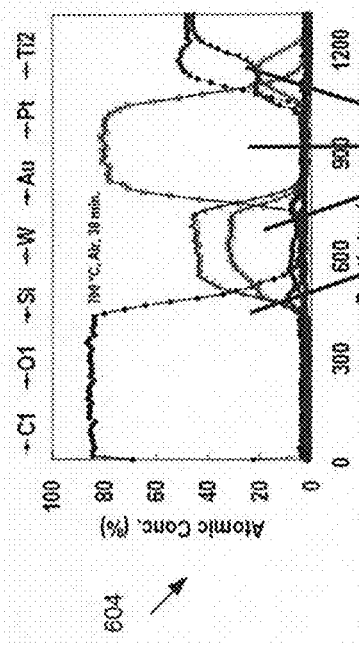
Figure 6D:
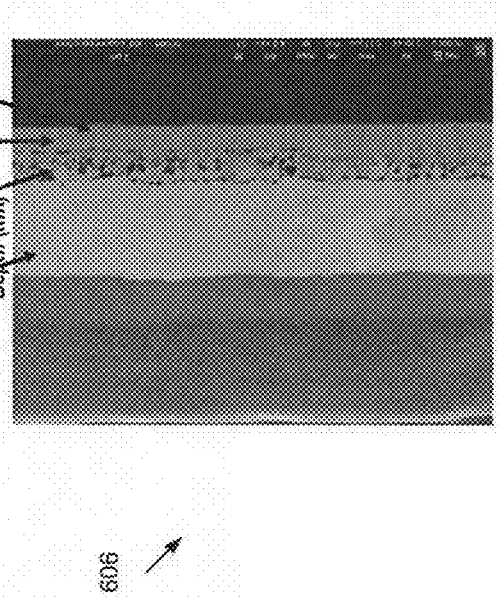

FIGS. 6A-6F (Sample 8) illustrates Pt (300 nm)/Ti (100 nm)/W (300 nm) DBS with Ti/W Ohmic Contact. After annealing at 600° C. and 700° C., the ohmic contact constituents (titanium and tungsten silicides and titanium carbide) remained undisturbed. See graph 600 of FIG. 6A and image of FIG. 6B. The AES depth profile of graph 600 and corresponding FIB-FESEM image 602 after 600° C. are shown in FIGS. 6A and 6B, and similarly, the AES depth profile of graph 604 and corresponding FIB-FESEM image 606 after 700° C. are shown in FIGS. 6C and 6D. The inward migration of gold (Au) was also contained by the Ti/Pt bi-layer. No new oxygen ($O_2$) was able to penetrate into and beyond the Ti/Pt layer, thereby preventing the oxidation of the metallization. The surface morphology, shown in images 608 and 610 of FIGS. 6E and 6F, respectively, appears to remain smooth after both anneals.

To explore the long-term diffusion barrier characteristics of the W/Ti/Pt system on Ti/W ohmic contact, a sample was soaked at 700° C. for additional 5 hours. The AES depth profile and the corresponding FIB FE-SEM images are shown in graph 700 of FIG. 7A and image 702 of FIG. 7B, respectively. The time at 700° C. was extended for a total of 123 hours in air. The results are shown in AES depth profile of graph 704 (FIG. 7C) and FIB FE-SEM image 706 (FIG. 7D), respectively. The results after both extended time are comparable to previous anneals of FIGS. 6A-6F.

Put simply, gold (Au) and the adventitious oxygen ($O_2$) diffusions appeared to be through platinum (Pt) grain boundaries and less through platinum (Pt) grains. The platinum (Pt) grain boundaries are pre-diffused with titanium (Ti) element and the grain boundary width is on the average about 7 nm, which thus presents a tortuous path for further gold (Au) and oxygen ($O_2$) migration.

One or more embodiments of the present invention prevent diffusion of unwanted elements that would degrade device operation at 600° C. This is an enabler to SiC sensors and electronics needed to operate reliably and robustly in high temperature environments without the need for cooling. This may be applied on devices to ensure long term operational stability of the devices. The absence of cooling translates to reduced weight of the packaged sensor. The absence of a bulky cooling package allows for ease of sensor insertion further into the test article.

It will be readily understood that the components of various embodiments of the present invention, as generally described and illustrated in the figures herein, may be arranged and designed in a wide variety of different configurations. Thus, the detailed description of the embodiments, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. An apparatus, comprising:
   a silicon carbide (SiC) substrate;
   an ohmic contact metallization layer disposed directly on the SiC substrate;
   a diffusion barrier stack disposed directly on the ohmic contact metallization layer, wherein the diffusion barrier stack comprises a platinum (Pt) layer and an additional layer formed of titanium (Ti) or tantalum silicide ($TaSi_2$); and
   a contact pad disposed on the diffusion barrier stack, wherein the diffusion barrier stack is configured to prevent diffusion of free silicon into the contact pad during operation at a temperature of 600° C.

2. The apparatus of claim 1, wherein the diffusion barrier stack includes a tungsten and silicon layer upon which the platinum layer is disposed.

3. The apparatus of claim 1, wherein the additional layer is a titanium layer upon which the platinum layer is disposed.

4. The apparatus of claim 1, wherein the diffusion barrier stack comprises the platinum layer, a tantalum silicide layer disposed on the platinum layer, and a second platinum layer disposed on the tantalum silicide layer, wherein the additional layer is the tantalum silicide layer.

5. The apparatus of claim 4, wherein the the platinum layers possess the same thickness.

6. An apparatus, comprising:
   a silicon carbide (SiC) substrate;
   an ohmic contact metallization layer disposed directly on the SiC substrate;
   a diffusion barrier layer disposed on the ohmic contact metallization layer, wherein the diffusion barrier layer comprises platinum (Pt) and an additional material selected from the group consisting of titanium (Ti) and tantalum silicide ($TaSi_2$); and
   a contact pad metallization layer disposed on the diffusion barrier layer, wherein the contact pad metallization layer is exposed to oxygen, wherein the diffusion barrier layer is configured to prevent diffusion of free silicon into the contact pad metallization layer during a period of operation at 600° C., wherein the diffusion barrier layer is configured to prevent diffusion of the oxygen into the ohmic contact metallization layer during the period of operation.

7. The apparatus of claim 6, wherein the ohmic contact metallization layer is constructed of an alloy of nickel and tungsten, wherein the ohmic contact metallization reacts with the SiC substrate to form silicides of nickel and tungsten and a carbide of tungsten.

8. The apparatus of claim 6, wherein the ohmic contact metallization layer is constructed of one of $W_x:Ni_y$ and $Pt_x:Ti_y:Si_z$.

9. The apparatus of claim 6, wherein the contact pad is disposed directly on the diffusion barrier layer.

10. The apparatus of claim 9, further comprising the a tungsten and silicon layer disposed between the ohmic contact metallization layer and the diffusion barrier layer.

11. The apparatus of claim 6, wherein the diffusion barrier layer includes $TaSi_2$.

12. The apparatus of claim 11, wherein the diffusion barrier layer comprises a first platinum layer, a tantalum silicide layer disposed on the first platinum layer, and a second platinum layer disposed on the tantalum silicide layer.

13. The apparatus of claim 12, wherein the wherein the tantalum silicide layer is thicker than the first and second platinum layers.

14. The apparatus of claim 12, wherein the the first and second platinum layers possess the same thickness.

* * * * *